United States Patent
Itokawa et al.

(10) Patent No.: US 7,049,650 B1
(45) Date of Patent: May 23, 2006

(54) SEMICONDUCTOR DEVICE

(75) Inventors: Hiroshi Itokawa, Yokohama (JP); Koji Yamakawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/024,422

(22) Filed: Dec. 30, 2004

(30) Foreign Application Priority Data

Nov. 22, 2004 (JP) ............................... 2004-337654

(51) Int. Cl.
*H01L 27/108* (2006.01)

(52) U.S. Cl. .................. 257/310; 257/311; 257/295; 257/306; 257/296

(58) Field of Classification Search ............... 257/295, 257/310, E21.009
See application file for complete search history.

(56) References Cited

U.S. PATENT DOCUMENTS

| | | | |
|---|---|---|---|
| 6,351,006 B1 | 2/2002 | Yamakawa et al. | |
| 6,479,849 B1* | 11/2002 | Katori | 257/296 |
| 6,693,791 B1* | 2/2004 | Nakamura | 361/302 |
| 6,924,519 B1* | 8/2005 | Itokawa et al. | 257/295 |
| 2001/0015448 A1 | 8/2001 | Kawakubo et al. | |
| 2003/0119273 A1* | 6/2003 | Aggarwal et al. | 438/396 |
| 2003/0127674 A1* | 7/2003 | Ramesh | 257/295 |
| 2003/0143853 A1* | 7/2003 | Celii et al. | 438/694 |
| 2004/0155278 A1* | 8/2004 | Natori et al. | 257/306 |
| 2004/0217404 A1* | 11/2004 | Itokawa et al. | 257/303 |
| 2005/0001251 A1* | 1/2005 | Itokawa et al. | 257/296 |

FOREIGN PATENT DOCUMENTS

| | | |
|---|---|---|
| JP | 11-220095 | 8/1999 |
| JP | 2000-208725 | 7/2000 |
| JP | 2000-260954 | 9/2000 |
| JP | 2001-189430 | 7/2001 |

OTHER PUBLICATIONS

U.S. Appl. No. 10/986,060, filed Nov. 12, 2004, Itokawa et al.

* cited by examiner

Primary Examiner—George Eckert
Assistant Examiner—Paul Budd
(74) Attorney, Agent, or Firm—Oblon, Spivak, McClelland, Maier & Neustadt, P.C.

(57) ABSTRACT

A semiconductor device comprises a capacitor including a bottom electrode, a top electrode, and a dielectric film, the bottom electrode comprising a first conductive film containing iridium, a second conductive film provided between the dielectric film and the first conductive film and formed of a noble metal film, a third conductive film provided between the dielectric film and the second conductive film and formed of a conductive metal oxide film having a perovskite structure, and a diffusion prevention film provided between the first conductive film and the second conductive film and including at least one of a metal film and a metal oxide film, the diffusion prevention film preventing diffusion of iridium contained in the first conductive film, the dielectric film including an insulating metal oxide film having a perovskite structure, the insulating metal oxide film being expressed by $A(Zr_xTi_{1-x})O_3$ (A is at least one A site element, $0<x<0.35$).

11 Claims, 4 Drawing Sheets

SEMICONDUCTOR DEVICE

CROSS-REFERENCE TO RELATED APPLICATIONS

This application is based upon and claims the benefit of priority from prior Japanese Patent Application No. 2004-337654, filed Nov. 22, 2004, the entire contents of which are incorporated herein by reference.

BACKGROUND OF THE INVENTION

1. Field of the Invention

The present invention relates to a semiconductor device having a capacitor.

2. Description of the Related Art

In recent years, many efforts have been made to develop ferroelectric memories using a ferroelectric film as a dielectric film of a capacitor, that is, FeRAMs (Ferroelectric Random Access Memories). A typical ferroelectric film used for a ferroelectric memory is a $Pb(Zr_xTi_{1-x})O_3$ film (PZT film) having a perovskite structure.

If a PZT film is used as a ferroelectric film, electrodes are composed of conductive perovskite type metal oxide films such as $SrRuO_3$ films (SRO films) or the like in order to, for example, improve their fatigue characteristic. For example, Jpn. Pat. Appln. KOKAI Publication No. 2000-208725 and Jpn. Pat. Appln. KOKAI Publication No. 2000-260954 describe ferroelectric capacitors having electrodes each made of a stacked film composed of an SRO film and a Pt film.

Further, what is called a COP (Capacitor On Plug) structure has been proposed in which a capacitor is formed on a plug in order to increase the degree of integration of the ferroelectric memory. In the COP structure, to prevent the plug from being oxidized by thermal treatment, a bottom electrode of the capacitor is partly composed of an Ir film or Ir oxide film, which has an excellent oxygen barrier characteristic.

However, with this structure, Ir disadvantageously diffuses through the conductive perovskite type metal oxide film or a capacitor dielectric film, which degrades the characteristics or reliability of the capacitor. For example, Ir may react with Pb in the PZT film to form a conductive oxide, which increases a leak current of the capacitor or Ir may react with Sr in the SRO film to degrade the crystallinity of the SRO film, which degrades the characteristics or reliability of a dielectric film on the SRO film.

Thus, a problem with a capacitor having a capacitor dielectric film made of a metal oxide film having a perovskite structure is that the diffusion of Ir may degrade the characteristics or reliability of the capacitor.

BRIEF SUMMARY OF THE INVENTION

According to an aspect of the present invention, there is provided a semiconductor device comprising a capacitor provided above the semiconductor substrate and including a bottom electrode, a top electrode, and a dielectric film provided between the bottom electrode and the top electrode, the bottom electrode comprising a first conductive film containing iridium, a second conductive film provided between the dielectric film and the first conductive film and formed of a noble metal film, a third conductive film provided between the dielectric film and the second conductive film and formed of a conductive metal oxide film having a perovskite structure, and a diffusion prevention film provided between the first conductive film and the second conductive film and including at least one of a metal film and a metal oxide film, the diffusion prevention film preventing diffusion of iridium contained in the first conductive film, and the dielectric film including an insulating metal oxide film having a perovskite structure, the insulating metal oxide film being expressed by $A(Zr_xTi_{1-x})O_3$ (A is at least one A site element, $0<x<0.35$).

DETAILED DESCRIPTION OF THE INVENTION

Embodiments of the present invention will be described below with reference to the drawings.

Embodiment 1

Figure 1:
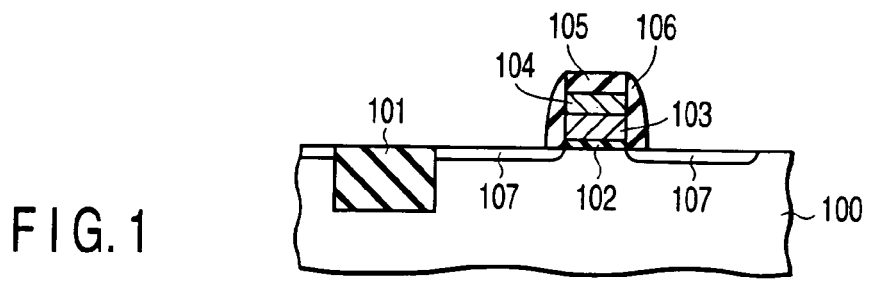
FIGS. 1 to 3 are sectional views schematically showing a method of manufacturing a semiconductor device according to a first embodiment of the present invention.
Figure 2:
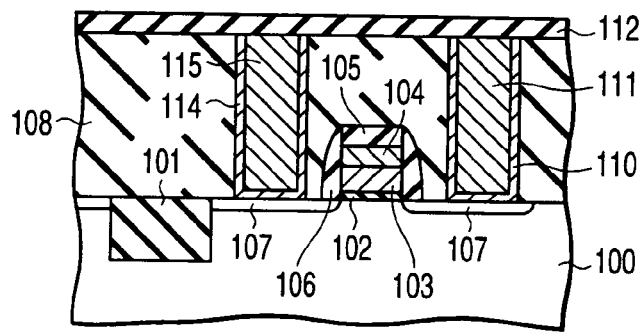
Figure 3:
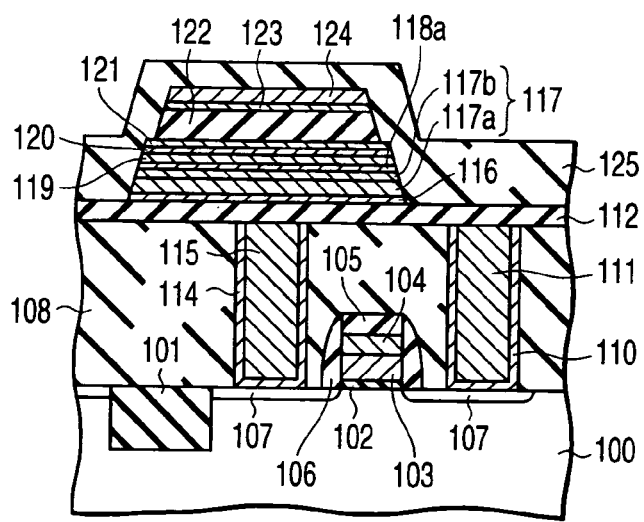

FIGS. 1 to 3 are sectional views schematically showing a method of manufacturing a semiconductor device according to a first embodiment of the present invention.

First, as shown in FIG. 1, an isolation region 101 of an STI (Shallow Trench Isolation) structure is formed on a p-type silicon substrate (semiconductor substrate) 100. Subsequently, an MIS transistor is formed as described below.

First, as a gate insulating film 102, a silicon oxide film of thickness about 6 nm is formed by thermal oxidization. Subsequently, arsenic-doped $n^+$ type polysilicon film 103 is formed on the gate insulating film 102. Moreover, a $WSi_x$ film 104 and a silicon nitride film 105 are formed on the polysilicon film 103. Subsequently, the polysilicon film 103, the $WSi_x$ film 104, and the silicon nitride film 105 are processed by a normal photo lithography process and a normal RIE process to form a gate electrode. Subsequently, a silicon nitride film 106 is deposited all over the surface of the resulting structure. Moreover, RIE is carried out to form side wall spacers formed of the silicon nitride film 106, on side walls of the gate electrode. Although not described in detail, in the present step, source/drain regions 107 are formed by ion implantation and thermal treatment.

Then, as shown in FIG. 2, a CVD (Chemical Vapor Deposition) process is used to deposit a silicon oxide film 108 all over the surface of the resulting structure. Further, a CMP process is used to execute a flattening process. Subsequently, a contact hole is formed through the silicon oxide film 108 so as to reach one of the source/drain regions 107. Then, a sputtering process or the CVD process is used to deposit a titanium film. Subsequently, the titanium film is nitrided by thermal treatment in a foaming gas to form a TiN film 110. Moreover, the CVD process is used to deposit a tungsten film 111. Subsequently, the CMP process is used to remove the TiN film 110 and tungsten film 111 from outside the contact hole, while leaving the TiN film 110 and the tungsten film 111 in the contact hole. This forms a plug connected to one of the source/drain regions 107. Then, the CVD process is used to deposit a silicon nitride film 112 all over the surface of the resulting structure. Furthermore, a control hole is formed so as to reach the other source/drain region 107. Subsequently, a method similar to that described above is used to form a TiN film 114 and a tungsten film 115 in the contact hole. This forms a plug connected to the other source/drain region 107.

Then, as shown in FIG. 3, a titanium (Ti) film 116 of thickness about 10 nm is deposited by the sputtering process. Subsequently, as a first conductive film 117, an iridium (Ir) film 117a of about 100 nm thickness and an iridium oxide ($IrO_2$) film 117b of about 50 nm thickness are sequentially deposited by the sputtering process. The iridium film 117a and the iridium oxide film 117b have an excellent oxygen barrier characteristic and can thus prevent the oxidization of the plug 115 during the subsequent thermal treatment step. Subsequently, as a diffusion prevention film, a titanium (Ti) film 118a of thickness about 2.5 nm is deposited by the sputtering process. The titanium film 118a prevents the upward diffusion of the iridium contained in the iridium film 117a and iridium oxide film 117b. Subsequently, as a second conductive film, a platinum (Pt) film 119 of thickness about 50 nm is deposited by the sputtering process. Then, as a seed layer, a titanium film 120 of about 1.5 nm thickness is deposited by the sputtering process. Moreover, as a third conductive film, an $SrRuO_3$ film (SRO film) 121 of thickness about 2.5 nm is deposited on the titanium film 120 by the sputtering process. Subsequently, the SRO film 121 is crystallized by RTA (Rapid Thermal Annealing) in an oxygen atmosphere. The SRO film 121 with an excellent crystallinity can be easily formed by depositing the film at a temperature of, for example, 500° C.

Then, as a dielectric film (ferroelectric film) of the capacitor, a $Pb(Zr_xTi_{1-x})O_3$ film (PZT film) 122 having a thickness of about 130 nm is formed by the sputtering process. Moreover, the PZT film 122 is crystallized by RTA in an oxygen atmosphere. In the present embodiment, the value of x is 0.30. That is, as the PZT film 122, a $Pb(Zr_{0.3}Ti_{0.7})O_3$ film is formed.

Then, an SRO film 123 having a thickness of about 10 nm is deposited by the sputtering process. Moreover, the SRO film 123 is crystallized by RTA in an oxygen atmosphere. The SRO film 123 with an excellent crystallinity can be easily formed by depositing the film at a temperature of, for example, 500° C. Furthermore, a platinum film 124 of thickness about 50 nm is deposited by the sputtering process.

Then, the CVD process is used to deposit a silicon oxide film (not shown) all over the surface of the resulting structure. Moreover, the photo lithography process and the RIE process are used to pattern the silicon oxide film. Subsequently, the patterned silicon oxide film is used as a mask to etch the platinum film 124, the SRO film 123, and the PZT film 122 by the RIE process. Furthermore, the photo lithography process and the RIE process are used to pattern the SRO film 121, the titanium film 120, the platinum film 119, the titanium film 118a, the iridium oxide film 117b, the iridium film 117a, and the titanium film 116.

In this manner, a ferroelectric capacitor is formed which comprises a bottom electrode having the titanium film 116, the iridium film 117a, the iridium oxide film 117b, the titanium film 118a, the platinum film 119, the titanium film 120, and the SRO film 121, and a dielectric film formed of the PZT film 122, and a top electrode having the SRO film 123 and the platinum film 124.

In the ferroelectric capacitor forming step described above, the top electrode film, dielectric film and bottom electrode film may be patterned by the same lithography and etching process. In this case, side surfaces of the top electrode, dielectric film and bottom electrode are positioned substantially within a same plane.

Then, the CVD process is used to deposit a silicon oxide film 125 all over the surface of the ferroelectric capacitor. Subsequently, to recover from damage to the PZT film 122 during etching, the capacitor is thermally treated at a temperature of about 650° C. in an oxygen atmosphere. During the thermal treatment, the tungsten plug 115 is prevented from being oxidized because the surface of the tungsten plug 115 is covered with the iridium film 117a and iridium oxide film 117b, which have an excellent oxygen barrier characteristic. Further, since the titanium film 118a is formed on the iridium oxide film 117b, it blocks the diffusion of the iridium contained in the iridium film 117a and iridium oxide film 117b. It is thus possible to prevent the iridium from diffusing to the SRO film 121 and the PZT film 122 through the platinum film 119.

The subsequent steps are not shown. A ferroelectric memory having a COP (Capacitor On Plug) structure is completed by subsequently forming a contact connected to the tungsten film 111, drive lines and bit lines, metal interconnects, and the like.

Figure 4:
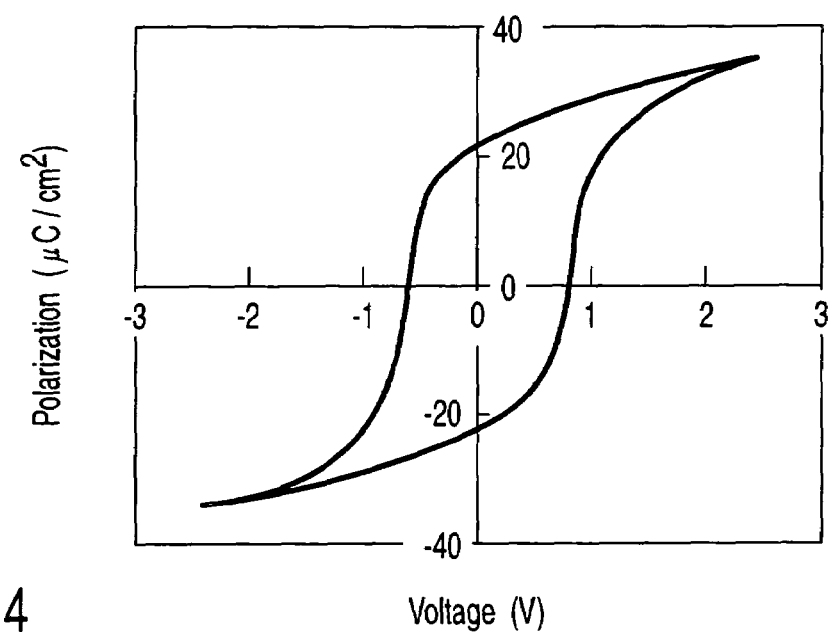
FIG. 4 is a graph showing a hysteresis characteristic of a capacitor according to the first embodiment of the present invention.
Figure 5:
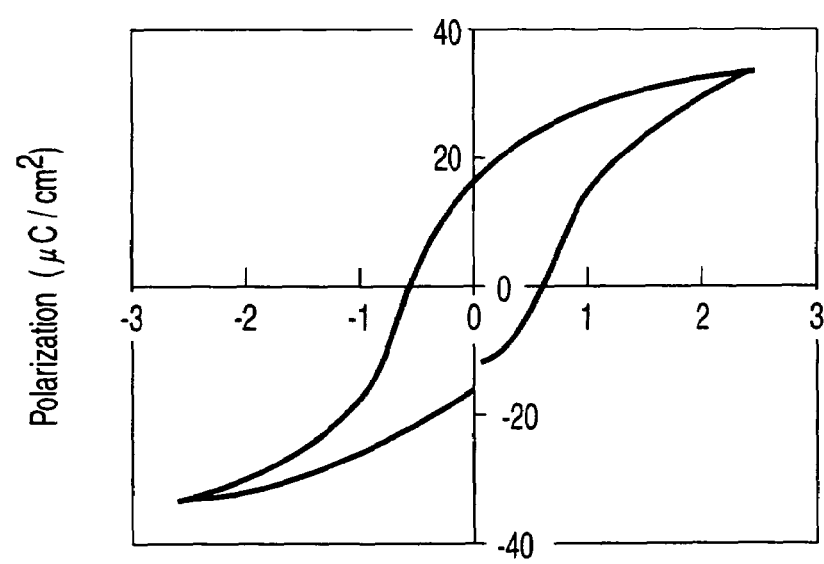
FIG. 5 is a graph showing a hysteresis character-istic of a capacitor according to a comparative example of the first embodiment of the present invention.

FIG. 4 is a graph showing the hysteresis characteristic of a capacitor formed using a process similar to the above described process. FIG. 5 is a graph showing the hysteresis characteristic of a capacitor according to a comparative example. The axis of abscissa indicates a voltage applied to the capacitor, while the axis of ordinate indicates the polarization of the capacitor.

Specifically, for a sample according to the present embodiment, the following films are sequentially formed on a silicon oxide film on a silicon substrate: a titanium film (thickness: 10 nm), an iridium film (thickness: 100 nm), an iridium oxide film (thickness: 50 nm), a titanium film (thickness: 2.5 nm), a platinum film (thickness: 50 nm), a titanium film (thickness: 1.5 nm), an SRO film (thickness: 2.5 nm), a PZT film ($Pb(Zr_{0.3}Ti_{0.7})O_3$ film, thickness: 130 nm), an SRO film (thickness: 10 nm), and a platinum film (thickness: 50 nm).

For a sample according to the comparative example of the present embodiment, the following films are sequentially formed on a silicon oxide film on a silicon substrate: a titanium film (thickness: 10 nm), an iridium film (thickness: 100 nm), an iridium oxide film (thickness: 50 nm), a platinum film (thickness: 50 nm), a titanium film (thickness: 2.5 nm), an SRO film (thickness: 10 nm), a PZT film ($Pb(Zr_{0.3}Ti_{0.7})O_3$ film, thickness: 130 nm), an SRO film (thickness: 10 nm), and a platinum film (thickness: 50 nm). That is, the capacitor according to the comparative example is not provided with any diffusion prevention film (corresponding to the titanium film 118a, shown in FIG. 3).

Comparison of FIG. 4 (present embodiment) with FIG. 5 (comparative example) clearly indicates that the capacitor according to the present embodiment has a markedly improved quantity of switching charges ($Q_{SW}$) and a markedly improved squareness compared to the capacitor of the comparative example. That is, the capacitor according to the present embodiment has a markedly improved hysteresis characteristic compared to the capacitor of the comparative example.

Figure 6:
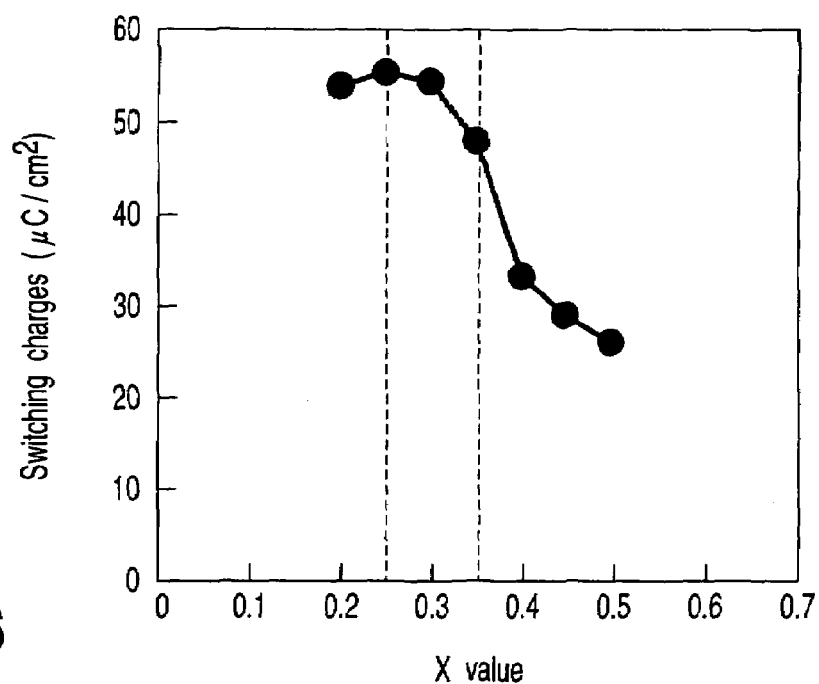
FIG. 6 is a graph showing the relationship between an x value and the quantity of switching charges for a $Pb(Zr_xTi_{1-x})O_3$ film (PZT film) according to the first embodiment of the present invention.

FIG. 6 is a graph showing the relationship between an x value and the quantity of switching charges for the $Pb(Zr_xTi_{1-x})O_3$ film (PZT film) in a sample similar to that described in FIG. 4.

As shown in FIG. 6, when the x value is 0.35 or more, the quantity of switching charges decreases rapidly. That is, when the x value is 0.35 or more, the capacitor characteristic is rapidly degraded. Accordingly, to obtain a favorable capacitor characteristic, it is necessary that the x value is less than 0.35 (0<x<0.35). Further, if the x value is 0.25 or less, it is generally difficult to form a PZT film with an excellent crystallinity or the like. Therefore, preferably, 0.25<x<0.35.

Figure 7:
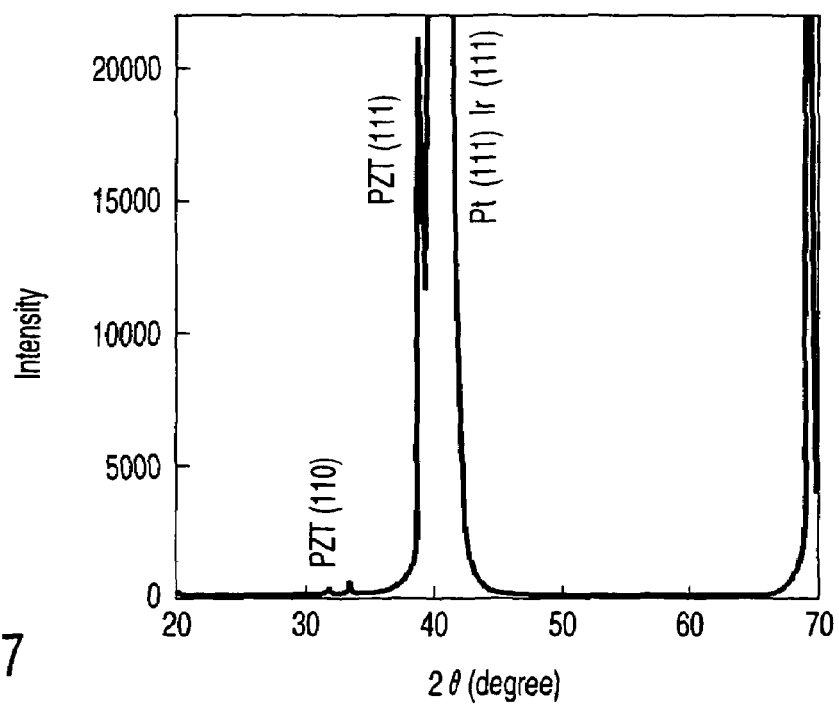
FIG. 7 is a graph showing the intensity of an XRD pattern according to the first embodiment of the present invention.
Figure 8:
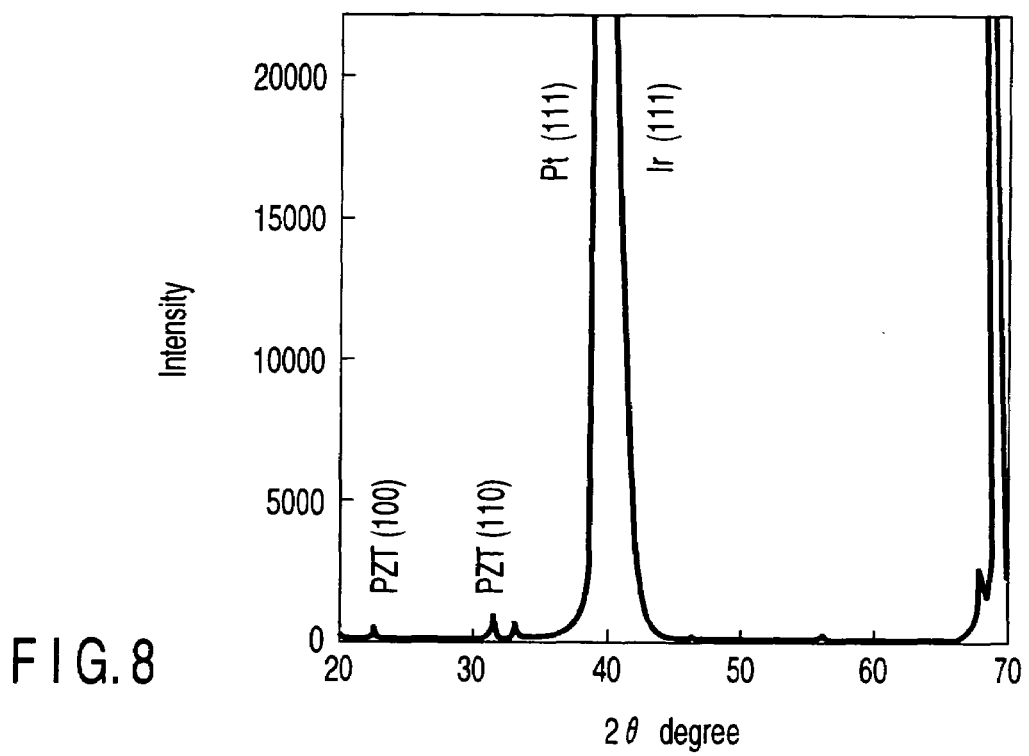
FIG. 8 is a graph showing the intensity of the XRD pattern according to a comparative example of the first embodiment of the present invention.

FIG. 7 is a graph showing the XRD pattern of a sample according to the present embodiment. FIG. 8 is a graph showing the XRD pattern of a sample according to the comparative example of the present embodiment. The axis of abscissa indicates angle (2θ), while the axis of ordinate indicates intensity.

For the sample according to the present embodiment, the following films are sequentially formed on a silicon oxide film on a silicon substrate: a titanium film (thickness: 10 nm), an iridium film (thickness: 100 nm), an iridium oxide film (thickness: 50 nm), a titanium film (thickness: 2.5 nm), a platinum film (thickness: 50 nm), a titanium film (thickness: 1.5 nm), an SRO film (thickness: 2.5 nm), and a PZT film ($Pb(Zr_{0.3}Ti_{0.7})O_3$ film, thickness: 130 nm).

For the sample according to the comparative example, the following films are sequentially formed on a silicon oxide film on a silicon substrate: a titanium film (thickness: 10 nm), an iridium film (thickness: 100 nm), an iridium oxide film (thickness: 50 nm), a platinum film (thickness: 50 nm), a titanium film (thickness: 2.5 nm), an SRO film (thickness: 10 nm), and a PZT film ($Pb(Zr_{0.3}Ti_{0.7})O_3$ film, thickness: 130 nm). That is, the capacitor according to the comparative example is not provided with any diffusion prevention film (corresponding to the titanium film 118a, shown in FIG. 3).

For both samples according to the present embodiment and the comparative example, respectively, each of the PZT film and SRO film is obtained by forming an amorphous film by sputtering and then annealing the amorphous film in an oxygen atmosphere for crystallization.

Comparison of FIG. 7 (present embodiment) with FIG. 8 (comparative example) clearly indicates that the PZT film of the sample according to the comparative example has a random orientation and does not exhibit a favorable crystalliinty. In contrast, the PZT film of the sample according to the present embodiment exhibits a (111) orientation peak and thus a very favorable crystallinity.

As described above, according to the present embodiment, the titanium film 118a (diffusion prevention film), which acts as an effective barrier for the diffusion of the iridium, is provided between the platinum film 119 (second conductive film) and the stacked film (first conductive film) made of the iridium film 117a and the iridium oxide film 117b. This makes it possible to prevent the iridium from diffusing to the SRO film 121 (third conductive film) and PZT film 122 (dielectric film) through the platinum film 119. It is in turn possible to suppress the reaction of the iridium with elements contained in the SRO film or the reaction of the iridium with elements contained in the PZT film. Consequently, the degradation of the SRO and PZT films can be prevented. In particular, by setting the x value for the $Pb(Zr_xTi_{1-x})O_3$ film (PZT film) at 0<x<0.35, preferably 0.25<x<0.35, it is possible to obtain a reliable capacitor with excellent characteristics.

In general, the iridium oxide film does not exhibit the (111) orientation. Accordingly, if the platinum film is formed directly on the iridium oxide film, the platinum film also does not exhibit a favorable (111) orientation. It is thus not easy to obtain an SRO film or PZT film ($Pb(Zr_xTi_{1-x})O_3$ film, 0.25<x<0.35) having a favorable (111) orientation. In the present embodiment, the titanium film is formed between the iridium oxide film and the platinum film. This allows the platinum film to be easily (111) oriented, thus making it possible to obtain SRO and PZT films having a favorable (111) orientation. It is therefore possible to obtain favorable SRO and PZT films and thus a reliable capacitor with excellent characteristics.

Embodiment 2

Figure 9:
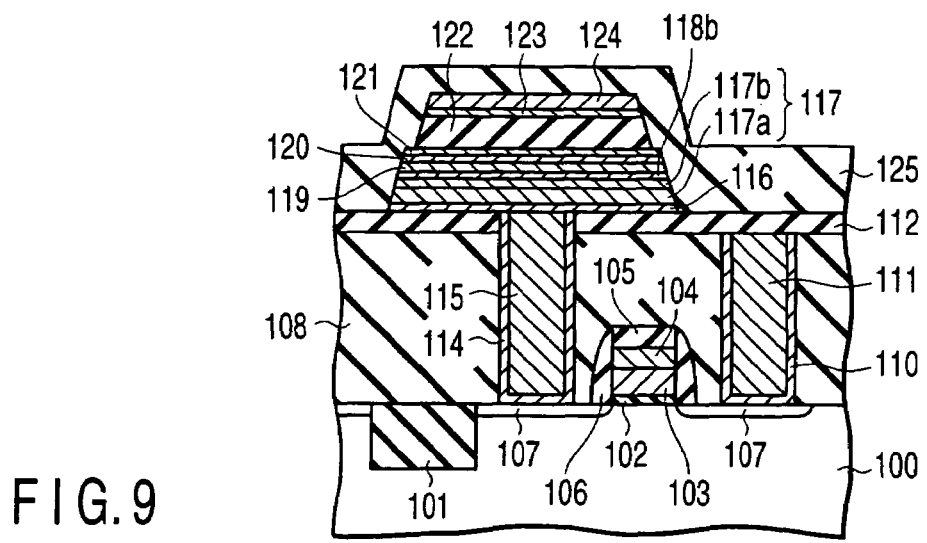
FIG. 9 is a sectional view schematically showing a method of manufacturing a semiconductor device according to a second embodiment of the present invention.

FIG. 9 is a sectional view schematically showing a method of manufacturing a semiconductor device according to a second embodiment of the present invention. The steps executed before the steps of forming a capacitor are similar to those shown in FIGS. 1 and 2 for the first embodiment.

After the step shown in FIG. 2 for the first embodiment, the titanium film 116 of thickness about 10 nm is deposited by the sputtering process as shown in FIG. 9. Subsequently, as the first conductive film 117, the iridium (Ir) film 117a of about 100 nm thickness and the iridium oxide ($IrO_2$) film 117b of about 50 nm thickness are sequentially deposited by the sputtering process. Subsequently, a titanium (Ti) film of thickness about 2.5 nm is deposited by the sputtering process. Moreover, the titanium film is oxidized by RTA in an oxygen atmosphere to form the titanium oxide film ($TiO_2$ film) 118b as a diffusion prevention film. The titanium oxide film 118b prevents the upward diffusion of the iridium contained in the iridium film 117a and iridium oxide film 117b. Subsequently, as a second conductive film, the platinum (Pt) film 119 of thickness about 50 nm is deposited by the sputtering process. Then, as a seed layer, the titanium film 120 of about 1.5 nm thickness is deposited by the sputtering process. Moreover, as a third conductive film, the $SrRuO_3$ film (SRO film) 121 of thickness about 2.5 nm is deposited on the titanium film 120 by the sputtering process. Subsequently, the SRO film 121 is crystallized by RTA in an oxygen atmosphere. The SRO film 121 with an excellent crystallinity can be easily formed by depositing the film at a temperature of, for example, 500° C.

Then, as a dielectric film (ferroelectric film) of the capacitor, the $Pb(Zr_xTi_{1-x})O_3$ film (PZT film) 122 having a thickness of about 130 nm is formed by the sputtering process. Moreover, the PZT film 122 is crystallized by RTA in an oxygen atmosphere. In the present embodiment, the value of x is 0.30. That is, as the PZT film 122, a $Pb(Zr_{0.3}Ti_{0.7})O_3$ film is formed.

Then, the SRO film 123 having a thickness of about 10 nm is deposited by the sputtering process. Moreover, the SRO film 123 is crystallized by RTA in an oxygen atmosphere. The SRO film 123 with an excellent crystallinity can be easily formed by depositing the film at a temperature of, for example, 500° C. Furthermore, the platinum film 124 of thickness about 50 nm is deposited by the sputtering process.

Then, the CVD process is used to deposit a silicon oxide film (not shown) all over the surface of the resulting structure. Moreover, the photo lithography process and the RIE process are used to pattern the silicon oxide film. Subsequently, the patterned silicon oxide film is used as a mask to etch the platinum film 124, the SRO film 123, and the PZT film 122 by the RIE process. Furthermore, the photo lithography process and the RIE process are used to pattern the SRO film 121, the titanium film 120, the platinum film 119, the titanium oxide film 118b, the iridium oxide film 117b, the iridium film 117a, and the titanium film 116.

In this manner, a ferroelectric capacitor is formed which comprises a bottom electrode having the titanium film 116, the iridium film 117a, the iridium oxide film 117b, the titanium oxide film 118b, the platinum film 119, the titanium film 120, and the SRO film 121, a dielectric film formed of the PZT film 122, and a top electrode having the SRO film 123 and the platinum film 124.

Then, the CVD process is used to deposit the silicon oxide film 125 all over the surface of the ferroelectric capacitor. Subsequently, to recover from damage done to the PZT film 122 during etching, the capacitor is thermally treated at a temperature of about 650° C. in an oxygen atmosphere. During the thermal treatment, the tungsten plug 115 is prevented from being oxidized because the surface of the tungsten plug 115 is covered with the iridium film 117a and iridium oxide film 117b, which have an excellent oxygen barrier characteristic. Further, since the titanium oxide film 118b is formed on the iridium oxide film 117b, it blocks the diffusion of the iridium contained in the iridium film 117a and iridium oxide film 117b. It is thus possible to prevent the iridium from diffusing to the SRO film 121 and the PZT film 122 through the platinum film 119.

The subsequent steps are not shown. A ferroelectric memory having the COP structure is completed by subsequently forming a contact connected to the tungsten film 111, drive lines and bit lines, metal interconnects, and the like.

As described above, according to the present embodiment, the titanium oxide film 118b is provided between the platinum film 119 (second conductive film) and the stacked film (first conductive film) made of the iridium film 117a and the iridium oxide film 117b. Thus, as in the case of the first embodiment, it is possible to obtain favorable SRO and PZT films and thus a reliable capacitor with excellent characteristics. Also in the present embodiment, the relationship between the x value and the quantity of switching charges for the $Pb(Zr_xTi_{1-x})O_3$ film (PZT film) exhibits a tendency similar to that shown in FIG. 6. Accordingly, as in the case of the first embodiment, by setting the x value for the PZT film at 0<x<0.35, preferably 0.25<x<0.35, it is possible to obtain a reliable capacitor with excellent characteristics.

Various changes may be made to the above first and second embodiments as described below.

The diffusion prevention film that prevents the diffusion of the iridium may be a metal film containing at least one of Ti, V, W, Zr, Co, Mg, Hf, Mo, Mn, Ta, Nb, Pb, and Al. Alternatively, it may be a metal oxide film containing at least one of Ti, V, W, Zr, Co, Mg, Hf, Mo, Mn, Ta, Nb, Pb, Al, and Ru. Alternatively, it may be a stacked film of the above metal film and metal oxide film. The metal oxide film may typically be a $TiO_2$ film, a $ZrO_2$ film, a $CoO_2$ film, $PbO_2$ film, $Al_2O_3$ film, an SRO film, an $Sr(Ru,Ti)O_3$ film, or the like. The stacked film of the metal film and metal oxide film may typically be a Ti/SRO film, a Ti/Sr(Ru,Ti)$O_3$ film, a Co/SRO film, a Co/Sr(Ru,Ti)$O_3$ film, or the like. The effect of the SRO film or Sr(Ru,Ti)$O_3$ film in suppressing the diffusion of iridium is mainly based on the reaction of iridium with the SRO film or Sr(Ru,Ti)$O_3$ film. Specifically, upon reacting with the SRO film or Sr(Ru,Ti)$O_3$ film, the iridium is consumed and thus prevented from diffusing upward. The reaction with the iridium may degrade the crystallinity of the SRO film or Sr(Ru,Ti)$O_3$ film. However, the SRO film or Sr(Ru,Ti)$O_3$ film, used as a diffusion prevention film, does not contact with the PZT film. Consequently, the degraded crystallinity does not substantially affect the PZT film or the like.

The first conductive film may be a single film of iridium (Ir), a single film of iridium oxide ($IrO_2$), or a stacked film of the iridium film and iridium oxide film.

The second conductive film may be a noble metal film including at least one of a platinum film and a ruthenium film.

The third conductive film may be a conductive metal oxide film having a perovskite crystal structure (general formula: $ABO_3$) and containing at least one of Ru, Co, and Ni. Typically, the third conductive film may be an $SrRuO_3$ film, a $(La,Sr)CoO_3$ film, a $BaRuO_3$ film, an $LaNiO_3$ film, or the like.

The dielectric film may be an insulating metal oxide film having a perovskite structure expressed by $A(Zr_xTi_{1-x})O_3$ (A denotes at least one A site element, 0<x<0.35, preferably 0.25<x<0.35). In particular, an insulating metal oxide film containing Pb as an A site element is desirably used. The insulating metal oxide film may typically be a $Pb(Zr_xTi_{1-x})O_3$ film (PZT film), a $(Pb,La)(Zr_xTi_{1-x})O_3$ film, or the like.

The plug may be a tungsten plug or a polysilicon plug.

The diffusion prevention film, the first conductive film, the second conductive film, the third conductive film, and the dielectric film may be formed using the sputtering process, the CVD process, or a sol-gel process.

The structure described in the foregoing embodiments can be applicable to a series connected TC unit type ferroelectric memory, which includes series connected memory cells each having a transistor having a source terminal and a drain terminal and a ferroelectric capacitor between the two terminals.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate;
   a capacitor provided above the semiconductor substrate and including a bottom electrode, a top electrode, and a dielectric film provided between the bottom electrode and the top electrode,
   the bottom electrode comprising a first conductive film containing iridium, a second conductive film provided between the dielectric film and the first conductive film and formed of a noble metal film, a third conductive film provided between the dielectric film and the second conductive film and formed of a conductive metal oxide film having a perovskite structure, and a diffusion prevention film provided between the first conductive film and the second conductive film and including at least one of a metal film and a metal oxide film, the diffusion prevention film preventing diffusion of iridium contained in the first conductive film, and
   the dielectric film including an insulating metal oxide film having a perovskite structure, the insulating metal oxide film being expressed by $A(Zr_xTi_{1-x})O_3$ (A is at least one A site element, 0<x<0.35).

2. The semiconductor device according to claim 1, wherein the metal film included in the diffusion prevention film contains at least one of Ti, V, W, Zr, Co, Mg, Hf, Mo, Mn, Ta, Nb, Pb, and Al.

3. The semiconductor device according to claim 1, wherein the metal oxide film included in the diffusion prevention film contains at least one of Ti, V, W, Zr, Co, Mg, Hf, Mo, Mn, Ta, Nb, Pb, Al, and Ru.

4. The semiconductor device according to claim 1, wherein the first conductive film includes at least one of an iridium film and an iridium oxide film.

5. The semiconductor device according to claim 1, wherein the second conductive film includes at least one of a platinum film and a ruthenium film.

6. The semiconductor device according to claim 1, wherein the conductive metal oxide film contains at least one of Ru, Co, and Ni.

7. The semiconductor device according to claim 1, wherein the conductive metal oxide film is selected from an $SrRuO_3$ film, an $(La,Sr)CoO_3$ film, a $BaRuO_3$ film, and an $LaNiO_3$ film.

8. The semiconductor device according to claim 1, wherein the insulating metal oxide film is expressed by $A(Zr_{x}Ti_{1-x})O_3$ (0.25<x<0.35).

9. The semiconductor device according to claim 1, wherein the A site element includes Pb.

10. The semiconductor device according to claim 1, further comprising a plug which is connected to the bottom electrode and on which the capacitor is formed.

11. The semiconductor device according to claim 10, further comprising a transistor provided on the semiconductor substrate and electrically connected to the plug.

* * * * *